(12) United States Patent
Stefanov et al.

(10) Patent No.: US 11,640,964 B2
(45) Date of Patent: May 2, 2023

(54) INTEGRATED CAPACITORS IN AN INTEGRATED CIRCUIT

(71) Applicant: NXP USA, Inc., Austin, TX (US)

(72) Inventors: Evgueniy Nikolov Stefanov, Vieille Toulouse (FR); Pascal Kamel Abouda, Saint Lys (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/504,721

(22) Filed: Oct. 19, 2021

(65) Prior Publication Data
US 2022/0173136 A1 Jun. 2, 2022

(30) Foreign Application Priority Data

Nov. 30, 2020 (EP) .................. 20306466

(51) Int. Cl.
| | | |
|---|---|---|
| H01L 27/13 | (2006.01) | |
| H01L 49/02 | (2006.01) | |
| H01L 27/08 | (2006.01) | |
| H01L 23/522 | (2006.01) | |
| H01L 29/94 | (2006.01) | |
| H01L 27/06 | (2006.01) | |
| H01L 27/12 | (2006.01) | |

(52) U.S. Cl.
CPC .......... H01L 27/13 (2013.01); H01L 23/5223 (2013.01); H01L 27/0805 (2013.01); H01L 28/40 (2013.01); H01L 28/87 (2013.01); H01L 28/90 (2013.01); H01L 29/94 (2013.01); H01L 29/945 (2013.01); *H01L 27/067* (2013.01); *H01L 27/0658* (2013.01); *H01L 27/1203* (2013.01)

(58) Field of Classification Search
CPC ............ H01L 23/5223; H01L 27/0658; H01L 27/067; H01L 27/0805; H01L 27/1203; H01L 27/13; H01L 28/87; H01L 28/90; H01L 29/94; H01L 29/945
See application file for complete search history.

(56) References Cited

U.S. PATENT DOCUMENTS

| | | |
|---|---|---|
| 6,737,698 B1 | 5/2004 | Paul et al. |
| 7,838,919 B2 | 11/2010 | Okamoto et al. |
| 8,570,707 B2 | 10/2013 | Fong et al. |
| 9,887,257 B2 | 2/2018 | Cui et al. |
| 10,777,636 B1 | 9/2020 | Paul |

(Continued)

*Primary Examiner* — Ahmed N Sefer

(57) ABSTRACT

There is disclosed herein an SOI IC comprising an integrated capacitor comprising a parallel arrangement of a metal-insulator-metal, MIM, capacitor, a second capacitor, a third capacitor, and a fourth capacitor:
wherein the second capacitor comprises as plates the substrate and a one of a plurality of semiconductor layers having an n-type doping, and comprises the buried oxide layer as dielectric;
the third capacitor comprises as plates the polysilicon layer and a further one of a plurality of semiconductor layers having an n-type doping, and comprises an insulating layer between the plurality of semiconductor layers and the metallisation stack as dielectric; and
the fourth capacitor comprises as plates the polysilicon plug and at least one of the plurality of semiconductor layers and comprises the oxide-lining as dielectric, wherein the oxide lining and the polysilicon plug form part of a lateral isolation (DTI) structure.

20 Claims, 14 Drawing Sheets

(56) References Cited

U.S. PATENT DOCUMENTS

| | | | |
|---|---|---|---|
| 2010/0127351 A1* | 5/2010 | Quinn | H01L 27/0207 |
| | | | 257/E29.343 |
| 2013/0009272 A1 | 1/2013 | Sakurai et al. | |
| 2014/0264751 A1 | 9/2014 | Chen et al. | |
| 2016/0148926 A1* | 5/2016 | Lee | H01L 29/94 |
| | | | 257/531 |
| 2016/0148929 A1* | 5/2016 | Lee | H01L 29/94 |
| | | | 257/531 |
| 2016/0260706 A1 | 9/2016 | Kawabata et al. | |
| 2018/0315702 A1 | 11/2018 | Kawashima et al. | |
| 2019/0378793 A1* | 12/2019 | Cheng | H01L 27/0629 |
| 2021/0020736 A1* | 1/2021 | Paul | H01L 27/1203 |
| 2021/0028165 A1* | 1/2021 | Yu | H01L 29/94 |

* cited by examiner

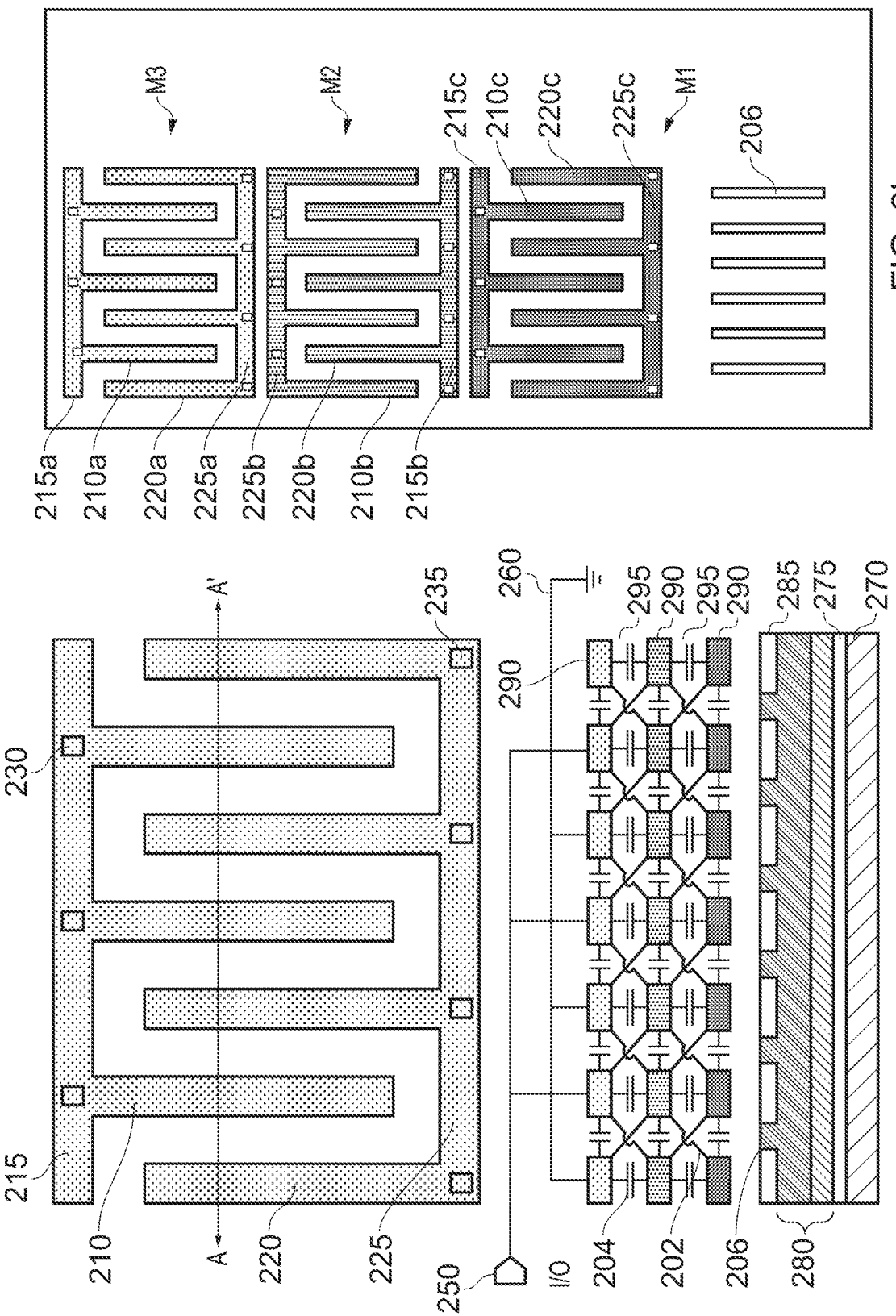

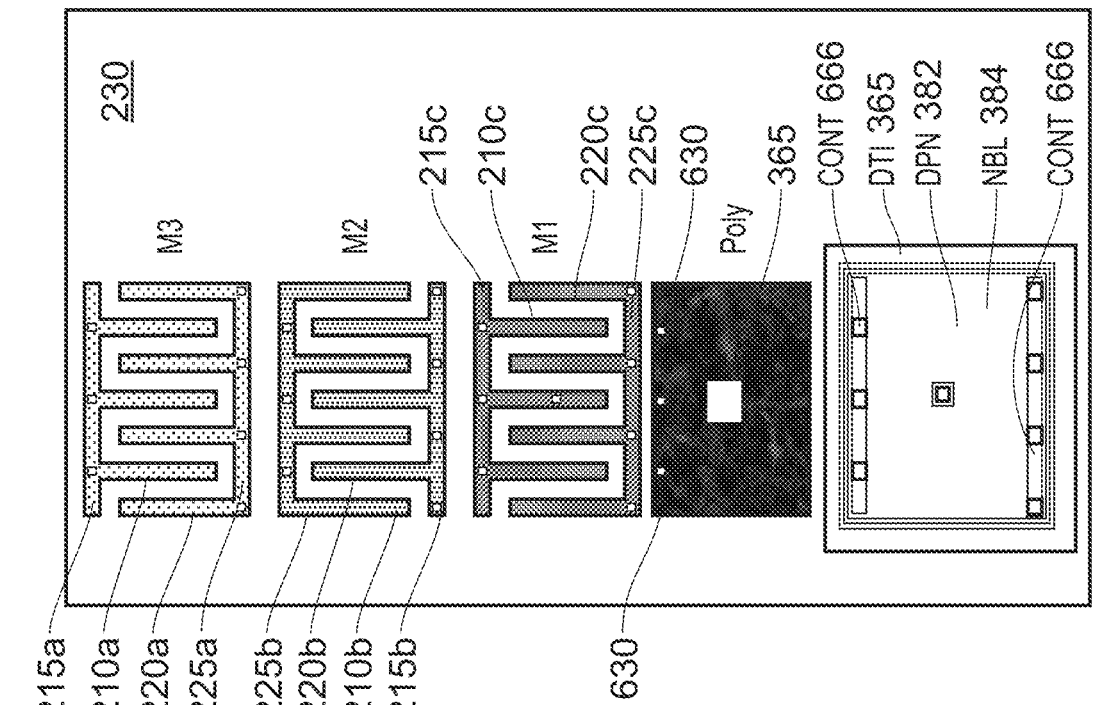
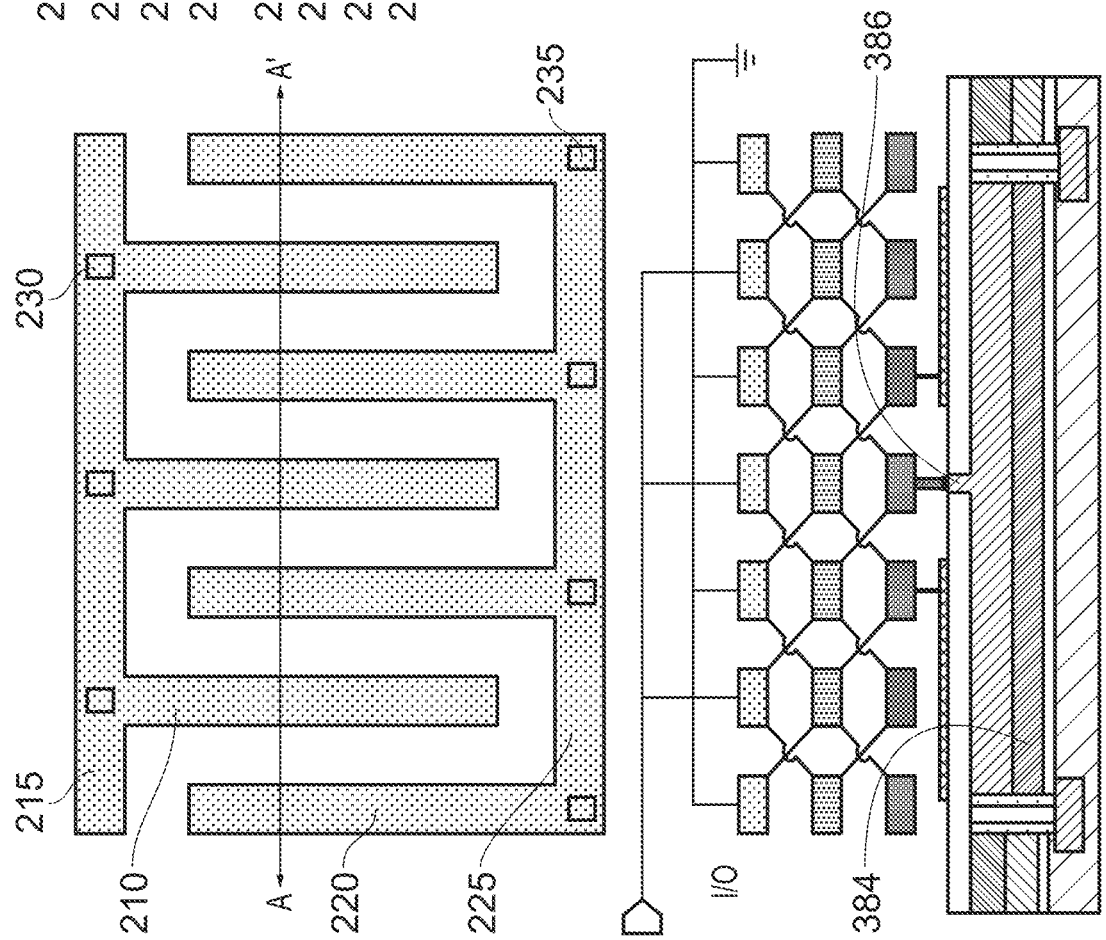
FIG. 6a
FIG. 6b

INTEGRATED CAPACITORS IN AN INTEGRATED CIRCUIT

FIELD

The present invention relates to integrated capacitors which are integrated into integrated circuits (ICs).

BACKGROUND

Modern day integrated circuits increasingly incorporate so-called passive components—that is to say capacitors, inductors, and resistors—integrated with active components such as transistors. Whereas it has long been recognised that so-called parasitics (that is to say capacitances, inductances and resistances which are an unavoidable result of the design of the active components) affect circuit performance, more recently circuits have been designed to deliberately introduce well-defined passive components into the integrated circuits. The benefits are self-evident—for example, fewer discrete passive components are required alongside the IC which simplifies circuit-board level assembly. However, since such integrated passive components occupy space on the integrated circuit chip, resulting in larger devices, they do increase the cost of each device.

Some types of integrated circuit present greater challenges than others for integrating passive components, and in particular as far as regards this disclosure is concerned, for integrating capacitors. For example, analogue circuits, in which currents are generally larger than for equivalent digital circuits present increased challenges since capacitances have to be correspondingly larger. Furthermore, the challenges are greater for high voltage circuits such as may be used for instance in automotive applications, since the higher operating voltages require either thicker, or higher quality, dielectric to avoid leakage within the capacitors.

Whereas a variety of different forms of integrated capacitances are known, and even some combinations thereof, in general combining integrated capacitances heretofore has been challenging.

SUMMARY

According the present disclosure, there is provided a silicon-on-insulator, SOI, integrated circuit, IC, comprising: a semiconductor substrate having first and second major surface; a buried oxide, BOX, layer on the first surface; a plurality of semiconductor layers over the BOX layer and comprising a plurality of regions and including at least an n-type buried layer (NBL) and a n-well (DPN); an insulating layer (STI) over the plurality of semiconductor layers; a patterned polysilicon layer (poly1) over the insulating layer; a metallisation stack comprising a plurality of patterned metal layers having layers of insulating material therebetween, the layers of insulating material each having a plurality of conducting vias therethrough connecting the patterned metal layers; a lateral isolation structure (DTI) comprising a plug of polysilicon material in a trench extending through the plurality of semiconductor layers to the first major surface and having an oxide lining; wherein the integrated circuit comprises an integrated capacitor comprising a parallel arrangement of a metal-insulator-metal, MIM, capacitor, a second capacitor, a third capacitor, and a fourth capacitor: wherein the MIM capacitor is comprised within the metallisation stack; the second capacitor comprises as plates the substrate and an n-type one of the plurality of semiconductor layers, and comprises the buried oxide layer as dielectric; the third capacitor comprises as plates the polysilicon layer and a further n-type one of the plurality of semiconductor layers and comprises the insulating layer as dielectric; and the fourth capacitor comprises as plates the polysilicon plug and at least one of the plurality of semiconductor layers and comprises the oxide-lining as dielectric.

The capacitance-per unit area may thereby be significantly increased, over known integrated capacitors, with acceptable linearity.

In one or more embodiments the MIM comprises a grid of conductive fingers separated by insulating material and is comprised in the metallisation stack, such that each patterned metal layer comprises a respective pair of comb-structured electrodes each having interdigitated fingers approximately perpendicular to a backbone, and each being galvanically coupled to a horizontally offset comb-structured electrode in a neighbouring layer, and wherein a one of the comb-structured electrodes on an upper metal layer comprises a first electrode of the integrated capacitor, and a one of the comb-structured electrodes on a lower-most metal layer is galvanically connected to the second capacitor. In one or more embodiments, the MIM capacitor has four metal layers.

In one or more embodiments the one of the comb-structured electrodes on an upper metal layer is the uppermost layer. Substantially all of the metal layers within the metallisation stack may be available for inclusion in the MIM capacitor.

In one or more embodiments, a thickness of one or more upper metal layers of the metallisation stack is greater than a thickness of one of more lower metal layers. Thus, with respect to layer thicknesses the conventional design rules for the backend design processing for standard semiconductors may be followed.

In one or more embodiments the lateral isolation structure (DTI) forms a perimeter of a region of the IC and the second capacitor, the third capacitor and the fourth capacitor each contained within the perimeter.

In one or more embodiments the SOI IC further comprises a transistor outside a perimeter of the integrated capacitor. The integrator capacitor may be used in conjunction with this or other transistors.

In one or more embodiments the plurality of semiconductors layers comprises an n-well layer having an N-type doping concentration of at least $5 \times 10^{\wedge}18$ cm$^{-2}$. Furthermore, the plurality of semiconductors layers may comprise a buried n-well layer having an N-type doping concentration of at least $5 \times 10^{\wedge}18$ cm$^{-2}$. In particular, the doping levels required for the remainder of the IC may be used without modification when designing the capacitances. The limitation in degrees of freedom may be countered by using area as a design parameter.

In one or more embodiments the n-well layer and the buried n-well layer fill the region of the IC defined by the perimeter. In one or more embodiments at least one of the buried oxide layer, the trench liner, and the insulation layer has a thickness in a range of 300-450 nm. The trench of the lateral isolation structure (DTI) may extends into the substrate. In one or more embodiments the semiconductor substrate underneath the polysilicon material in the trench has a higher doping level than a doping level of a rest of the semiconductor substrate underneath the MIM capacitor. This may assist in providing a particularly good conductivity for the electrode of the trench capacitor.

In one or more embodiments the horizontal offset between each comb-structured electrode and the comb-structured electrode in a neighbouring layer is equal to a finger spacing, such that oppositely galvanically connected fingers are vertically aligned. This may provide for a particularly efficient use of volume for the MIM capacitor.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which

FIGS. 2a, 2b and 2c show different aspects of a 3-level MIM capacitor similar to that illustrated in FIG. 1, assembled onto a semiconductor-on-insulator (SOI) integrated circuit (IC);

FIG. 6a shows the top-metal view, and a first partial cross-section of an integrated capacitor such as that shown in FIG. 3;

FIG. 6b shows an exploded view of various layers in an integrated capacitor such as that shown in FIG. 3;

Figure 1A:
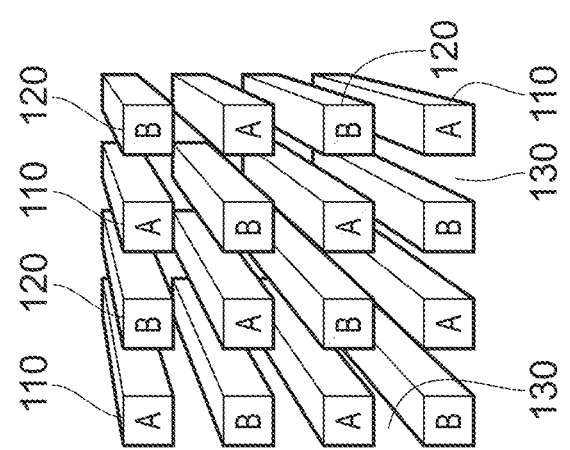
FIGS. 1a, 1b and 1c show different perspectives of a known MIM (metal-insulator-metal) capacitor integrated into the metal stack of an integrated circuit.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

Figure 1B:
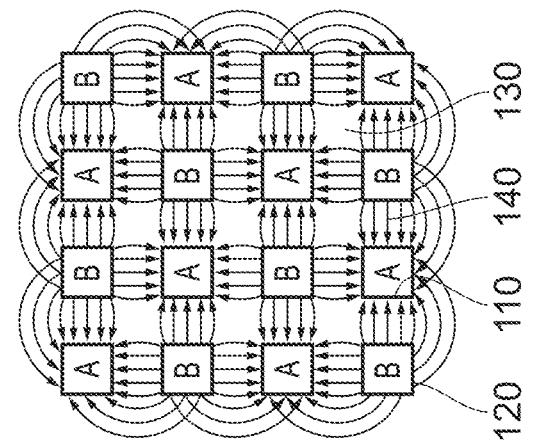
Figure 1C:
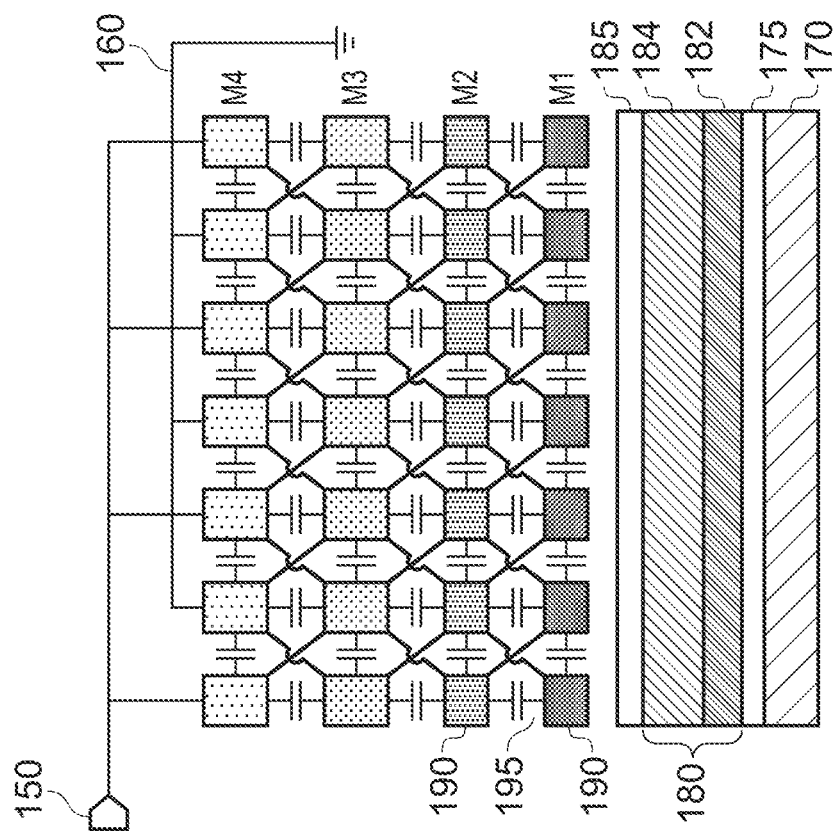

FIGS. 1a, 1b and 1c show different perspectives of a known MIM (metal-insulator-metal) capacitor integrated into the metallisation stack of an integrated circuit. FIG. 1a shows a perspective view of a matrix of rods or fingers, 110, 120 to form a MIM capacitor. One half of the rods, labelled A, 110, are connected together and these form the first electrode of the capacitor; the other half of the rods, labelled B, 120 are connected together to form the second electrode of the capacitor. The space 130 between the two sets of electrodes forms the dielectric. In a conventional MIM capacitor this dielectric is formed of the insulating layers (typically silicon oxide) between each of the metal layers in the metallisation stack of the IC.

FIG. 1B shows a vertical cross-section through such an MIM capacitor structure indicating the electric field lines 140. As can be seen, the field lines are predominately contained within the overall area of the capacitor.

Figure 10:
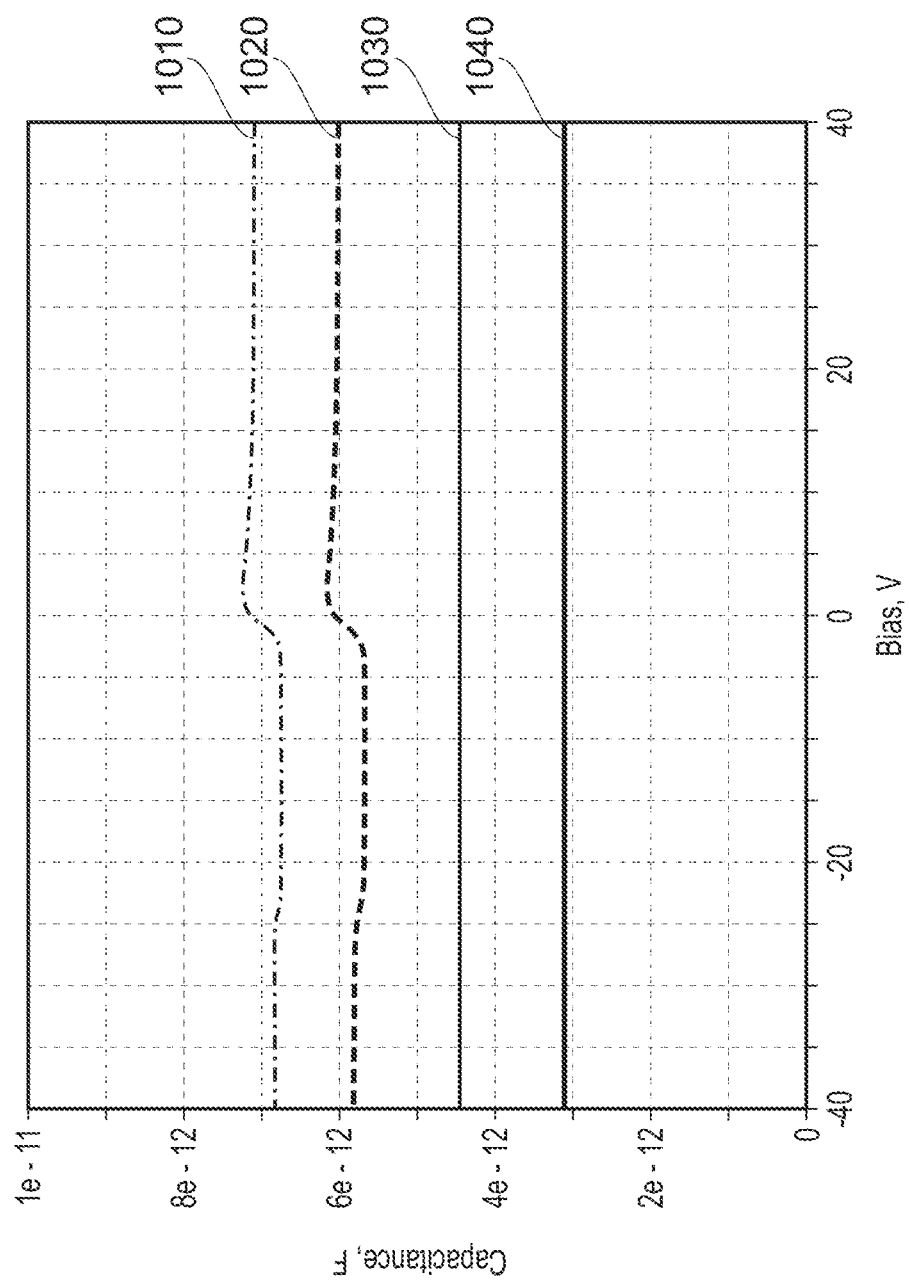
FIG. 10 shows capacitance-voltage (CV) curves for integrated capacitors according to 2 embodiments, compared with corresponding CV curves for stand-alone MIM capacitors.

FIG. 10 shows, schematically, the arrangement of such an MIM capacitor on an integrated circuit. One half of the fingers are connected together and to the first contact 150 of the MIM capacitor; the other half of the fingers are similarly connected together and to a ground 160. FIG. 1C shows the connectedness of the electrodes along both diagonal directions through the stack, which results in individual capacitors elements between each pair of neighbouring fingers both in a vertical direction and in a horizontal direction. FIG. 1c further shows the component layers of the integrated circuit underneath the metallisation stack. The integrated circuit is based on a substrate 170, which is electrically isolated from parts of the active device by means of a buried oxide layer, BOX, 175. On top of the BOX lies a plurality of semiconductor layers 180. These may generally be referred to as epi layers or epitaxial layers. They may typically include a p-type epi layer 182. Overlying the p-type epitaxial (p-epi) layer may be a p-doped well (p-well) layer 184. The plurality of semiconductor layers may include patterned layers having different doping types of different doping concentrations (not shown), which may be formed by processes such as diffusion and ion-implantation, and provide for the manufacture of fabrication of active semiconductor devices, such as will be familiar to the skilled person. Overlying the plurality of semiconductor layers is shown an insulating layer 185. This may typically take the form of a so-called shallow trench isolation (STI) layer. For the parts of the integrated circuit shown, the STI layer 185 shields the capacitor in the metallisation stack from the rest of the semiconductor layers.

Over the STI layer is a plurality of patterned metal layers M1, M2, . . . 190 separated by insulating layers 195 as mentioned above. As shown in FIG. 10 the plurality of metal layers form the electrodes of the MIM capacitor; elsewhere in the semiconductor integrated circuit, the plurality of metal layers provide connections to and between the various electrodes, such as gates, drains, sources etc. of the active components of the integrated circuit, again as will be familiar to the skilled person. Hereinbelow the series of metal layers separated by insulating layers will be described as the "metallisation stack". The metal layers may have the same thickness, or may have different thicknesses, as provided for in standard "back end of the line" processing. In one non-limiting example, the metal layers M1 and M2 may have a thickness of 250 nm, metal layer M3 and M4 may have thickness of 350 nm. In this example there may be an aluminium overlayer (sometimes designated AlCap) having a thickness of 2 μm, and a metal underlayer (sometimes designated ULM) having a thickness of 3.7 μm.

Figure 2C:
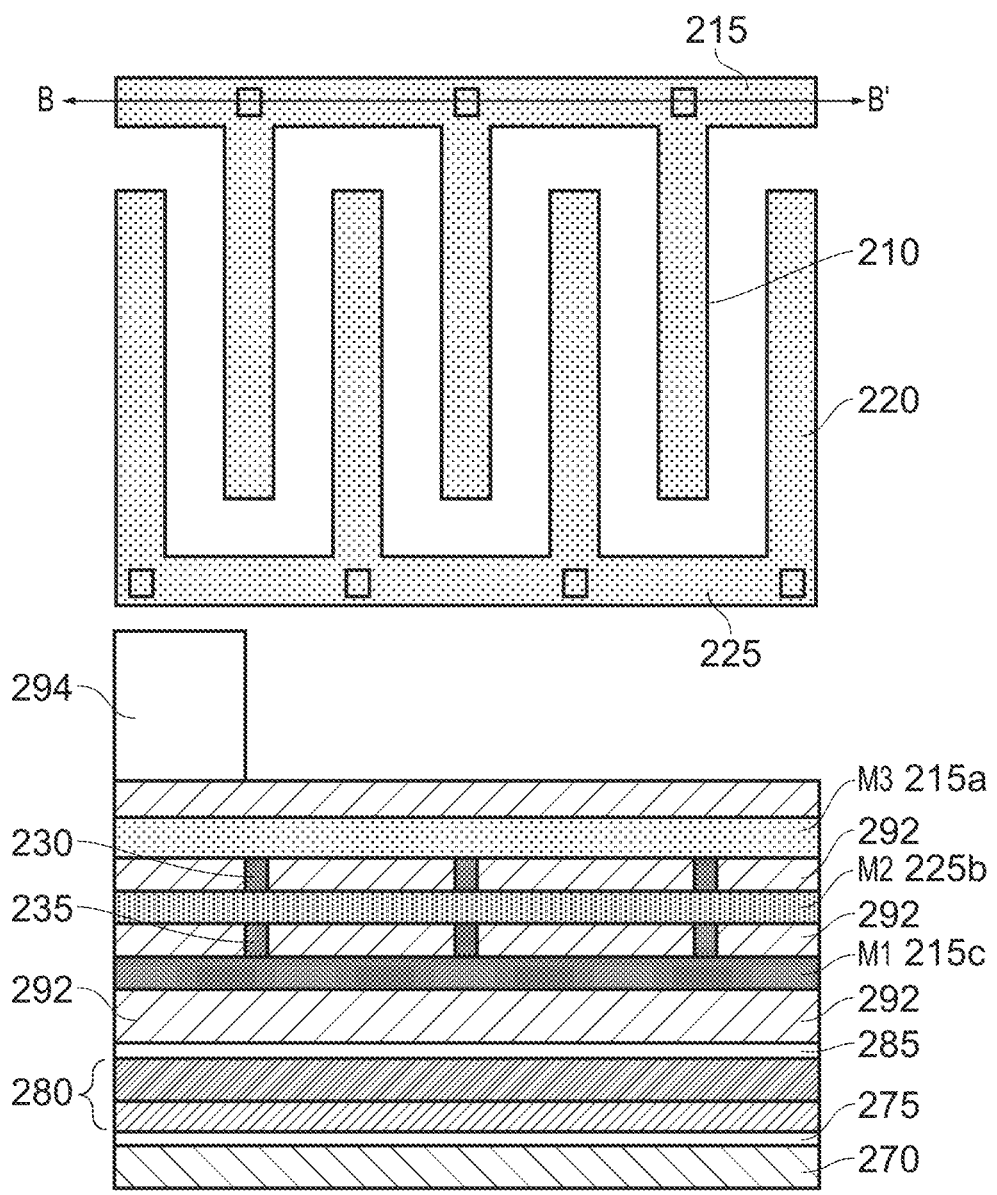

FIGS. 2a, 2b and 2c show different aspects of a 3-level MIM capacitor similar to that illustrated in FIG. 1, assembled onto a semiconductor-on-insulator (SOI) integrated circuit (IC) in more detail.

The upper part of FIG. 2a shows a view of the top patterned metal layer—M3 in this case. The metal layer M3 is patterned so as to provide two sets of fingers or digits 210 and 220. The two sets of fingers are interdigitated or interleaved. Each set of fingers is connected together by means of a backbone, being backbone 215 in the case of fingers 210 and backbone 225 in the case of fingers 220. Along each of the backbones is a series of vias 230, 235 which extends down from the top metal layer (and thus are not directly visible).

The lower part of FIG. 2a shows a schematic cross-section along line AA', which cuts across the interdigitated fingers. This view is similar to that shown in FIG. 1 and shows the substrate 270, buried oxide layer 275, plurality of semiconductor layer 280 and shallow trench isolation STI layer 285 underneath the metallisation stack formed of metal layers M1, M2 and M3 290 separated by insulating layer 295. The STI layer 285 has "gaps" in it, shown at 206, corresponding to parts of "active area" AA, i.e. semiconductor layers. The first group of electrodes are shown connected to a ground 260 and the second group are connected to a capacitor contact 250. This lower part of the figure also depicts the diagonal interconnectedness 202 between the metal fingers and the individual capacitance elements 204.

FIG. 2b shows, schematically, the three metal layers M1, M2, and M3 in more detail. As shown, M3 is patterned to provide the top layer 210a, 215a, of the first electrode 210, 215, together with the top layer 220a 215a of the second electrodes 220, 225; M2 is patterned to provide the middle layer 210b, 215b, of the first electrode 210, 215, together with the middle layer 220b, 215b of the second electrodes 220, 225; similarly, M1 is patterned to provide the middle layer 210c, 215c, of the first electrode 210, 215, together with the middle layer 220c, 215c of the second electrodes 220, 225. Finally, FIG. 2b also shows the layer 206, corresponding to an active area (AA).

The top part of FIG. 2c is a copy of the top part of FIG. 2a, and shows the position of the cross-section BB' depicted in the lower half of the figure. As shown, this cross-section is along the backbone 215 of the first electrode. Below the metallisation stack, the cross-section is again similar to that shown in FIG. 1, and shows the substrate 270, buried oxide layer 275, plurality of semiconductor layer 280 and shallow trench isolation STI layer 285. However, in this case the insulating layers 292 between the metal layers M1, M2 and M3 290 are explicitly shown. Moreover, in this cross-section, the patterning of the metal layers is not visible since the backbone is shown. However, this view does show the vias 230, 235 connecting neighbouring pairs M1 & M2, and M2 & M3 of the three metal layers M1, M2 and M3.

In addition, the lower part of FIG. 2c shows the contact region 294 in the top metal and above the layers of the metallisation stack forming the capacitor, and which forms the non-grounded contact 250 of the MIM capacitor.

Although MIM capacitors such as that described above can achieve relatively high capacitances with good linearity, there are some applications in which higher capacitance is required. Moreover, for some applications accurate linearity of the capacitor (that is to say the extent to which the voltage across the capacitor is directly proportional to the potential difference between the two plates or electrodes) may be required.

Figure 3:
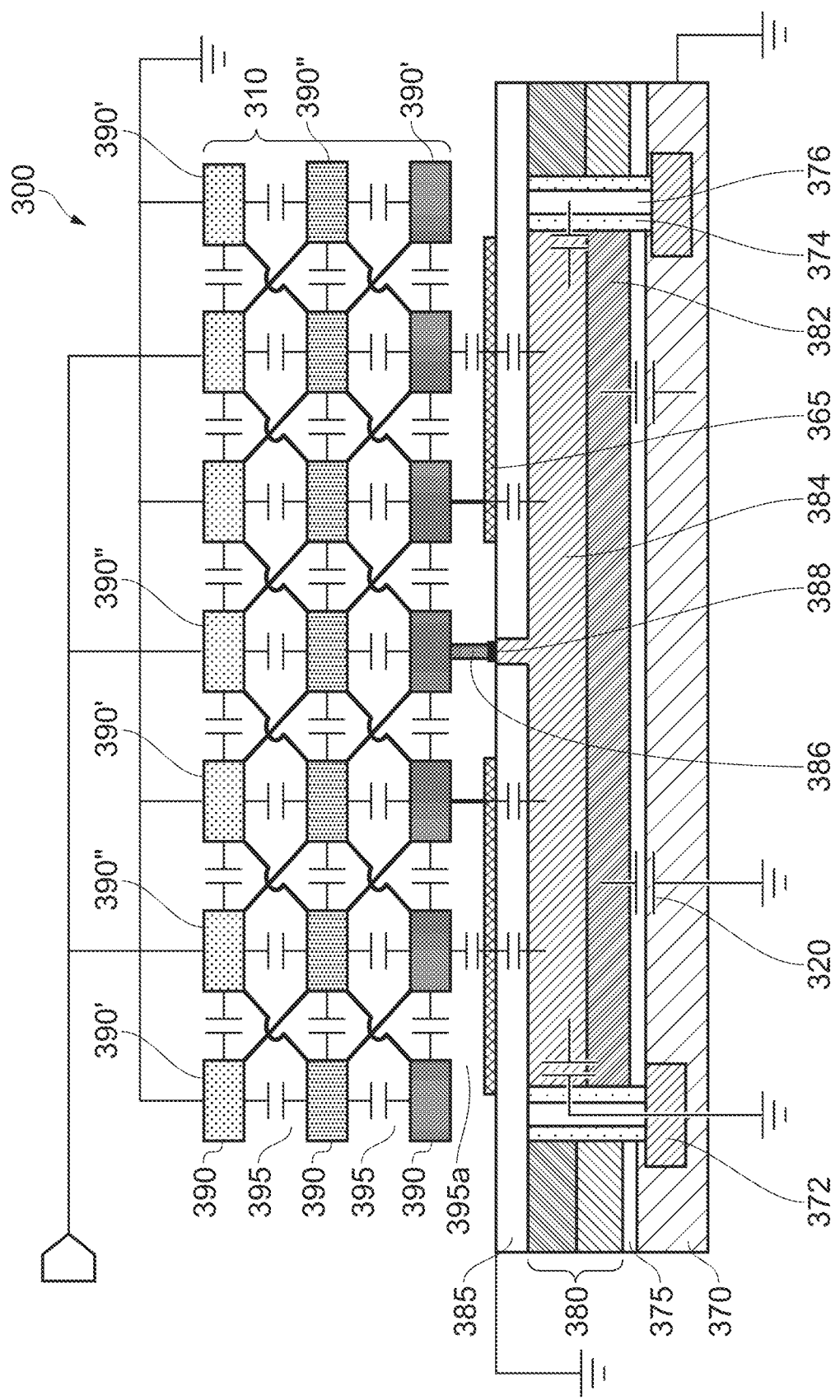
FIG. 3 shows, schematically, an IC comprising a multi-source capacitor comprising a three-level MIM together with three other sources of capacitance, according to one or more embodiments.

FIG. 3 shows, schematically, an IC comprising a multi-source capacitor comprising a three-level MIM together with three other sources of capacitance, according to one or more embodiments. Although one or more of these other sources of capacitance may be familiar to the skilled person, the inventors of the present disclosure have made the realisation that all of them may be combined without significantly degrading the linearity of the combined capacitance. This is particularly the case, when, as will be discussed in more detail hereinbelow, n-doped semiconductors layers (such as an n-well DPN or an n-type buried layer NBL) are used rather than p-type layers (such as p-epi of p-well).

FIG. 3 shows an integrated capacitor 300, comprising a three-level, also referred to as a three-layer, MIM capacitor 310 built into a metallisation stack of a SOI IC, along with three other designed-in capacitances. As discussed above, the MIM capacitor has electrodes formed of a stack of pairs of interdigitated fingers 390, in which the fingers of each one 390', 390" of the pair are connected together by a backbone, the stack being offset so that neighbouring fingers form part of the opposite electrodes both in a vertical (perpendicular to the IC surface) and a horizontal (parallel to the IC surface) direction. The patterned metal layers forming electrodes are separated by insulating layers 395, which together with the insulating material between neighbouring fingers within a metal layer formed the dielectric of the MIM capacitor.

The metallisation stack comprising the MIM capacitor has as its lowest level an insulating level layer 395a. The metallisation stack is fabricated in conventional and standard fabrication processes which will be well known to the person skilled in the art, during the latter parts of the manufacturer of the SOI integrated circuit (sometimes called "back-end"—BE, or "back-end-of-the-line"—BEOL—processing). The other three capacitive elements are designed into the early stages of the IC manufacture (sometimes called front-end—FE—processing), again using conventional and standard fabrication processes. The capacitive elements each make use of insulating layers which are fabricated during conventional device manufacturer, to form respective dielectric for the capacitive elements. They each have a commonly connected first electrode, being the substrate of the SOI IC. The second electrode of each of the three are also commonly galvanically connected to an I/O terminal or connection, to provide the integrated capacitor. It will be appreciated that in this context I/O refers to input/output of the integrated capacitor; it may or may not be an external I/O pin of the integrated circuit itself, and typically, in order to provide full benefits of integrated capacitor, will be directly connected to another part of the circuit of the IC. Considering the MIM capacitor in the metallisation stack as being the first element, the second element of the multisource integrated capacitor may be loosely termed a "BOX capacitor"; the third element of the multisource integrated capacitor may be loosely termed a "gate-poly capacitor", and the fourth element of the multi-source integrated capacitor may loosely be termed a "DTI liner" capacitor. These will now each briefly be described in turn.

Firstly, considering the "BOX capacitor". This is illustrated pictorially on FIG. 3 at 320. The first electrode of this capacitor element is the conductive substrate which is, typically, for a SOI IC an N-type silicon substrate. The second electrode is the lowermost epitaxial layer, or group of layers, 382, on the buried oxide layer, and the dielectric of this capacitive element is the buried oxide layer 375 itself. The layer or group of layers 382 is typically defined within the semiconductor processing as the "NBL" layer or N-type buried layer. Conventionally this layer is provided by over-doping the one or more epitaxial p-type layers grown on to the oxide in the SOI wafer manufacture, to provide a high doped N-type layer. The doping level of this layer is typically in a range of $10^{18}$-$10^{20}$ cm$^{-2}$, and may have a preferred range of $10^{19}$-$20^{20}$ cm$^{-2}$, or a preferred value of $5\times10^{19}$ cm$^{-2}$. This level of doping is sufficient for it to act as an "M" or metal-like electrode or plate of this parallel plate MOS capacitive element. The thickness of the buried oxide layer (the "O" layer of the MOS) may be chosen to suit the application, but the inventors have determined that a particularly useful range for the buried oxide layer is within the range 100-600 nm, and more particular between 300-400 nm. 350 nm has been, in an embodiment, found to produce effective results.

As mentioned above, the SOI IC includes a plurality of semiconductor layers 380 over the buried oxide layer 375. Some of the semiconductor layers may be patterned and/or have a range of different doping types and concentrations provided by conventional semiconductor processing steps including diffusion and iron implantation. The processing steps are chosen so as to provide the desired active devices in the IC. One of the processing steps which will be well known to the skilled person is to provide an insulating layer, which typically may be an oxide layer, or a stack of insulating layers including oxide layers and nitride layers, which overlies some of the active layers and provides isolation between the active layers and the later fabricated metallisation stack. It also typically provides isolation between the gate contact of the active device and the gate itself. This layer is conventionally known as the shallow trench isolation or STI layer, and is shown in FIG. 3 as layer 385. Since the STI layer is used in the active part of a SOI IC to provide isolation for the later deposited gate contact structure, which typically includes a poly silicon layer 365, it underlies the deposited (or grown) polysilicon layer 365.

A lateral portion of the STI layer 385 is designed to be the dielectric for the "gate-poly capacitor". And the first electrode of this gate-poly capacitor is the polysilicon layer 365 (used in the gate structure of active devices elsewhere on the IC). The other electrode of this capacitive element is the topmost layer or group of layers of the plurality of semiconductor layer 380. This layer is typically heavily doped N-type and is chosen as a DN well (DPN) or high voltage well (NHV) 394. The doping level of this layer is typically in a range of $10^{18}$-$10^{20}$ cm$^{-2}$, and may have a preferred range of $10^{19}$-$20^{20}$ cm$^{-2}$, or a preferred value of $5\times10^{19}$ cm$^{-2}$. Once again, one or other of these layers are formed by conventional device processing which is used to provide active devices elsewhere in the IC. In order for this capacitive element to form a part of the multisource capacitor, one electrode should be grounded and the other electrode connected to the common I/O electrode. In this instance the gate poly layer 365 is grounded to the substrate 370. There only remains to connect the N-well to the capacitor I/O electrode. This may achieved by a galvanic connection 388 through the STI, through an isolated part of the polysilicon layer 365, and a (typically metal) via 386 to the lowest metal layer in the MIM, and in particular to the comb structure in the lowest metal layer which is connected to the I/O terminal. This is illustrated in FIG. 3 schematically as connection 388, which may be centrally located. However, in practical devices, this connection is typically provided at the periphery of the integrated capacitor, such as will be discussed in more detail with respect to FIG. 6. The thickness of the STI oxide layer acting as dielectric is typically in the range of 250-650 nm or 500-600 nm. The inventors have found that a thickness of 400 nm provides a particularly effective capacitor contribution.

It will be appreciated that both the second capacitive elements (BOX capacitor) and the third capacitive element (gate-poly capacitor) take the form of parallel plate capacitance is with a horizontal (oxide) dielectric layer arranged between two horizontal plates electrodes. These capacitances thus scale directly with that area of the IC chip which is allocated as the integrated capacitor. Similarly, the MIM capacitor also scales with the area. In contrast, the fourth capacitive element scales with the perimeter of that area of the IC which is allocated as the integrated capacitor.

The fourth capacitive element, loosely termed as the "DTI-liner" capacitor, makes use of the construction of an isolation feature provided on some SOI ICs. This isolation feature is typically used to surround one or more active elements within the IC and in this case is used to surround the area of the integrated capacitor. The isolation is provided by etching a trench through the semiconductor layers 380 grown or deposited over the buried oxide and into the buried oxide 375 itself. The trench may thus be described as a deep trench, and the isolation feature as a deep trench isolation, DTI. In contrast with some other forms of deep trench isolation, in this case the DTI structure extends through the buried oxide layer, in order to make contact with the underlying substrate 370. In some embodiments the trench extends into the substrate. Typically, additional dopant may be introduced into the exposed substrate at the bottom of the trench either by diffusion or ion implantation, as shown at 372 in FIG. 3. This more heavily doped layer of the substrate may have a doping level which is typically in a range of $10^{18}$-$10^{20}$ cm$^{-2}$, and may be in a preferred range of $10^{19}$-$10^{20}$ cm$^{-2}$. In contrast, the substrate itself may have a much lower doping level, and typically has an n-type doping in a range of $2\times10^{14}$-$10^{16}$ cm$^{-2}$, and may have a preferred value of $10^{15}$ cm$^{-2}$. The trench is then lined using an insulating material 374. This may comprise deposited oxide or grown oxide. Conductive material, typically polysilicon, is then deposited into the central region of the trench 376. Since the trench surrounds the area of the integrated capacitor, it provides lateral isolation from the remainder of the IC. Furthermore, since the conductive material 376 is grounded to the semiconductor substrate 370, it may be used as one plate of an additional capacitor element. The lining of the trench forms the dielectric of the capacitor, and the edges of the semiconductor layers 870 which are in contact with the lining form the other plate or electrode. Typically, the oxide liner has a lateral thickness of between 200 and 600 nm or between 300 and 400 nm. The inventors have found that a thickness of 300 nm is particularly effective. As already mentioned, the magnitude of this capacitive element scales with the perimeter of the area of the integrated capacitor. The total area of the plates of this capacitor is the perimeter multiplied by the total thickness of the semiconductor layers and the DTI which typically equals approximately 5 μm. The doping level of the semiconductor layers in contact with the (inner) lining of the DTI trench are relatively high: they are typically in a range of $10^{18}$-$10^{20}$ cm$^{-2}$, and may have a preferred range of $10^{19}$-$10^{20}$ cm$^{-2}$, or a preferred value of $5\times10^{19}$ cm$^{-2}$, as already mentioned for the DPN layer.

Figure 4:
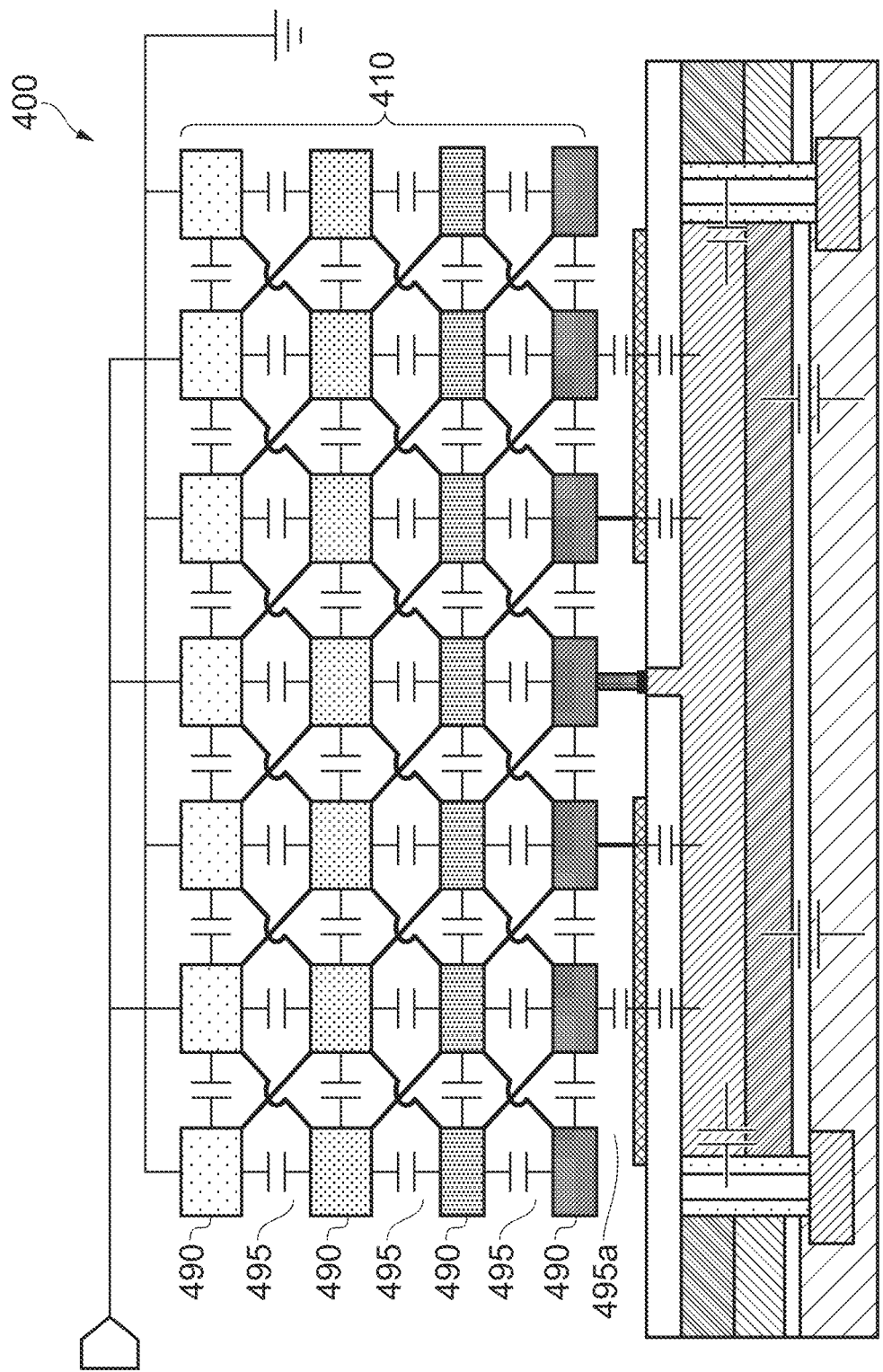
FIG. 4 shows a simplified circuit diagram of the integrated capacitor of FIG. 3.

FIG. 4 shows an integrated capacitor 400 comprising a four-level MIM capacitor 410 built into a metallisation stack of a SOI IC, along with three other designed-in capacitances. This embodiment is broadly similar to that shown in FIG. 3, with the exception that in this case the MIM capacitor has four metal levels or layers 490, each separated by dielectric material 495, together with an additional dielectric or insulating layer 495a, between the lowest metal layer M1 and the semiconductor layers. Since the galvanically-connected comb structures in each layer are diagonally offset from one another, in this case the ground-connected comb structure on the topmost of the four metal layers is directly over the I/O terminal-connected comb structure of the lowest layer which is galvanically connected to the semiconductor layer (typically "DPN layer") which forms the non-grounded electrode of the STI capacitor element. In contrast, in the three layer MIM capacitor element shown in FIG. 3, the I/O terminal-connected comb structure on the topmost of the—in that case three-metal layers is directly over the I/O terminal-connected comb structure of the lowest layer which is galvanically connected to the semiconductor layer 384 (typically "DPN layer") which forms the non-grounded electrode of the STI capacitor element.

Figure 5:
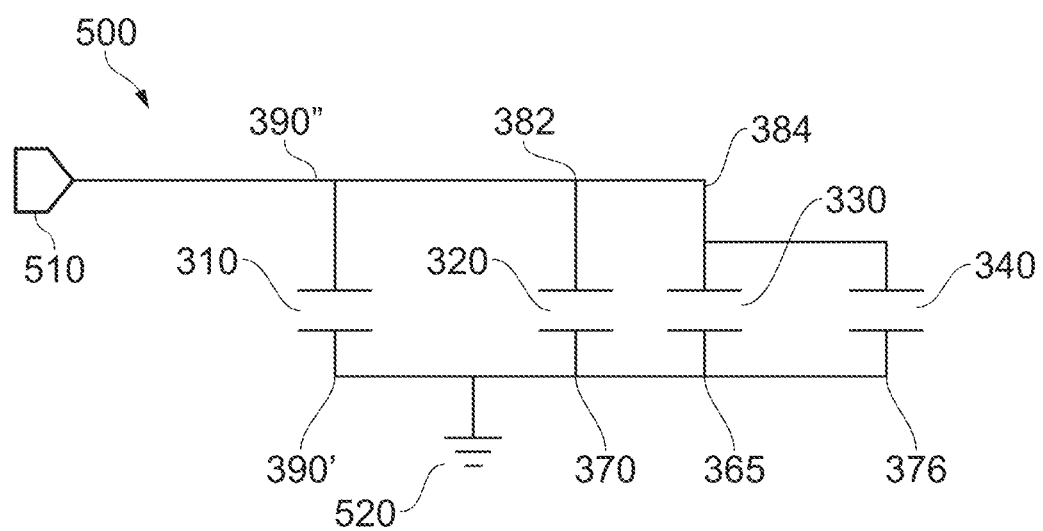
FIG. 5 shows, schematically, an IC comprising a multi-source capacitor comprising a four-level MIM together with other three sources of capacitance, according to one or more embodiments.

FIG. 5 shows a simplified equivalent circuit of an integrated capacitor according to one or more embodiments. The integrated capacitor 500 has a first terminal or electrode 510 which may also be described as a I/O electrode. The integrated capacitor has a second terminal 520 which is a ground. The capacitor comprises four, parallel connected, capacitors being the MIM capacitor 310, the BOX capacitor 320, the STI capacitor 330, and the DTI capacitor 340. As discussed above, the MIM capacitor has as an electrodes or plate, a one of the comb-structures in an upper metal layer (typically "M3", or "M4" using conventional semiconductor processing terms, wherein M1 is the lowermost metal layer in the metallisation stack).

Figure 6C:
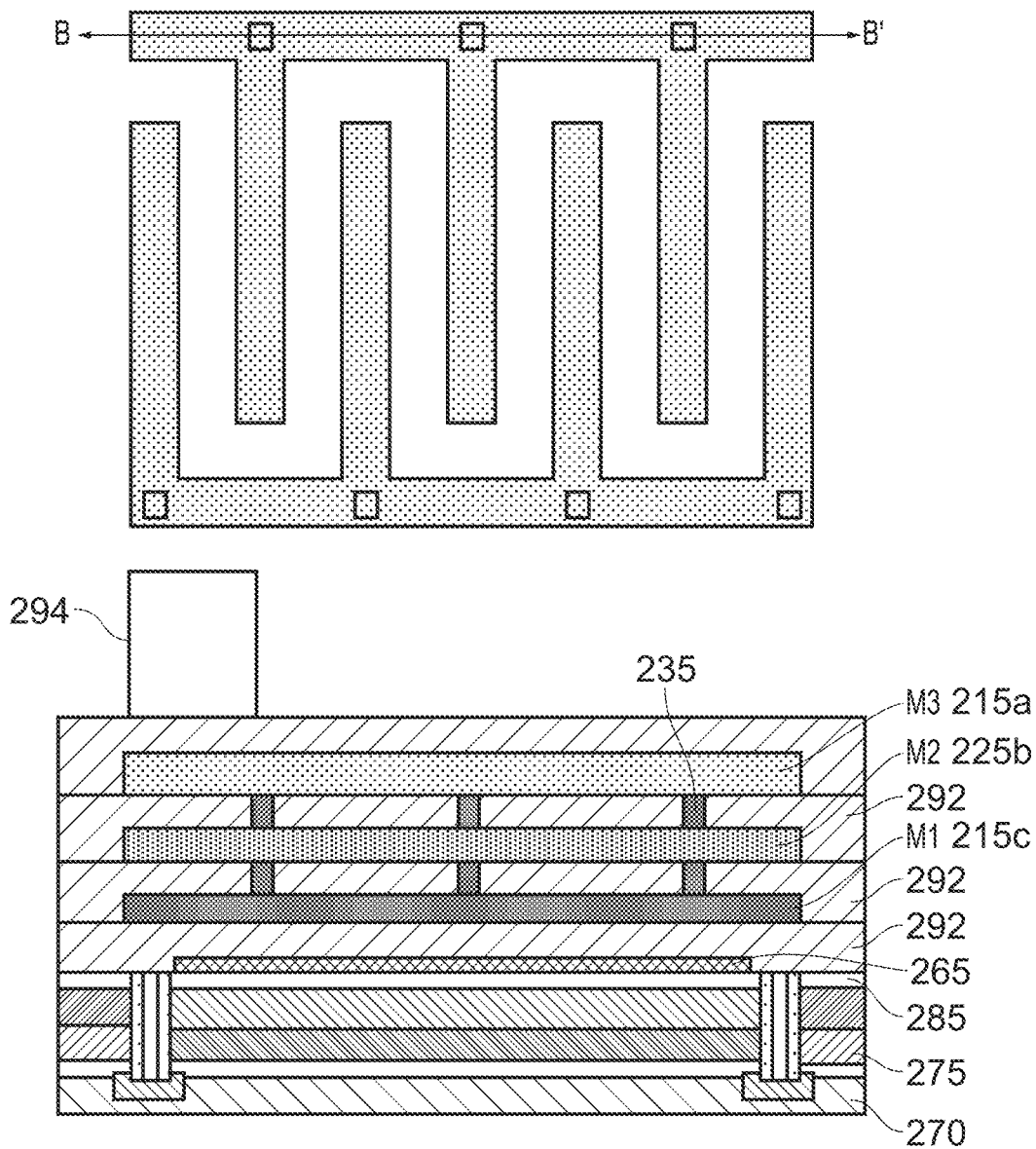
FIG. 6c shows the top metal view as shown in FIG. 6a, together with a second partial cross-section of an IC comprising an integrated capacitor such that shown in FIG. 3.

FIGS. 6a, 6b and 6c show a variety of views of an integrated capacitor comprising a three-level MIM and three other parallel capacitor elements, such as that shown in FIGS. 3a, 3b and 3c.

FIG. 6a shows, at the top, the topmost metal layer of the MIM having two comb-structures, one of which has fingers 210 connected to a backbone 215, and the other has fingers 220 connected to a backbone 225. The bottom half of FIG. 6a shows a schematic cross-section through AA', and is the same as FIG. 3.

FIG. 6b shows an exploded view of the various layers associated with the embodiment described in FIG. 6a. The top three layers are the MIM metal layers, as seen in FIG. 2b: thus, as shown, M3 is patterned to provide the top layer 210a, 215a, of the first electrode 210, 215, together with the top layer 220a 225a of the second electrodes 220, 225; M2 is patterned to provide the middle layer 210b, 215b, of the first electrode 210, 215, together with the middle layer 220b 225b of the second electrodes 220, 225; similarly, M1 is patterned to provide the middle layer 210c, 215c, of the first electrode 210, 215, together with the middle layer 220c 225c of the second electrodes 220, 225. FIG. 6b also shows the polysilicon layer 365 as shown in FIG. 3, extending over the area of the integrated capacitor. The polysilicon layer is connected to one of the comb-structures in each of the metal layers, and thereby grounded, by vias which, as shown at 630, may be aligned to the vias 230.

Also shown in FIG. 6b in plan view are various layers associated with the integrated capacitor, including the DTI polysilicon 376, the buried N-well layer NBL 382, the deep N-well DPN 384, and the metal contact 666 for connecting the metallisation stack to the underlying semiconductor.

It will be appreciated that the galvanic connection 386 and 388 between the top semiconductor layer 384 and the metal layers which connects to the I/O terminal and is visible towards the centre of FIG. 6a is not shown in FIG. 6b (although an associated gap, or hole, in the polysilicon layer 365 is shown in FIG. 6b). In practical implementations and embodiments of this connection is not made in the centre of the device—the depiction in FIG. 6a is for illustrative purposes only. Rather, typically, the connection between the layer 384 and the I/O terminal is made at the periphery of the integrated capacitor, as shown schematically by CONT 666. In general, then the gap or hole shown towards the centre of the polysilicon layer would then not be needed so would not be present.

FIG. 6c shows, in the top half of the figure, another copy of the view of the topmost metal layer of the MIM having two comb-structures, and shows the position BB' of the schematic cross-section shown in the lower half of the figure.

The cross-section shown the lower part of the figure is along the back-bone of the comb-structures in the metal layers, and shows the back-bones 215c, 225b and 215a of the three metal layers M1, M2 and M3 respectively, along with the dielectric layers 292 in between the metal layers. The vias 235 connecting the metal layers are also shown. This figure also shows a "top metal" layer 294. The figure also shows the lower dielectric layer 292 between the M1 backbone 215C and the poly layer 265, along with STI 285, buried oxide layer 275 and substrate 270.

Figure 7A:
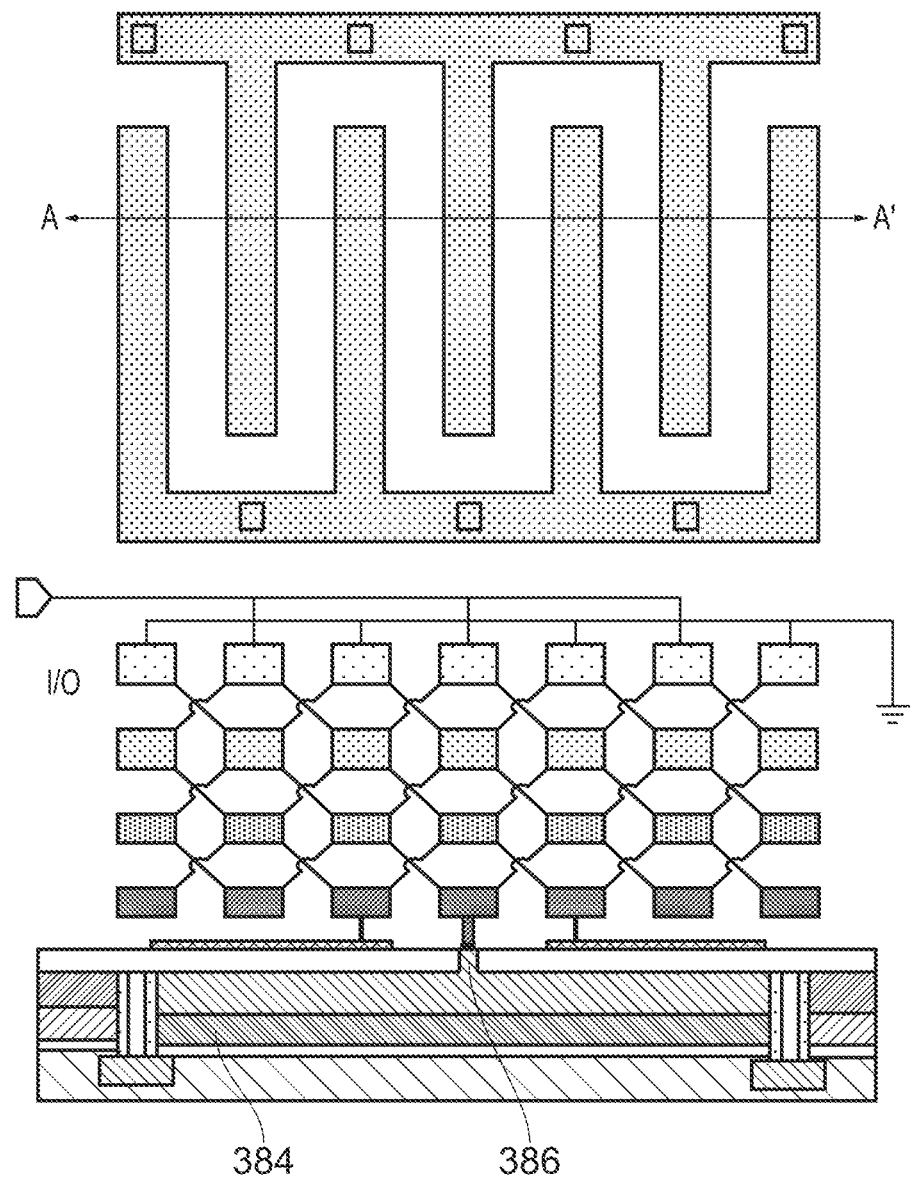
FIG. 7a shows the top-metal view, and a first partial cross-section of an integrated capacitor such as that shown in FIG. 4.
Figure 7B:
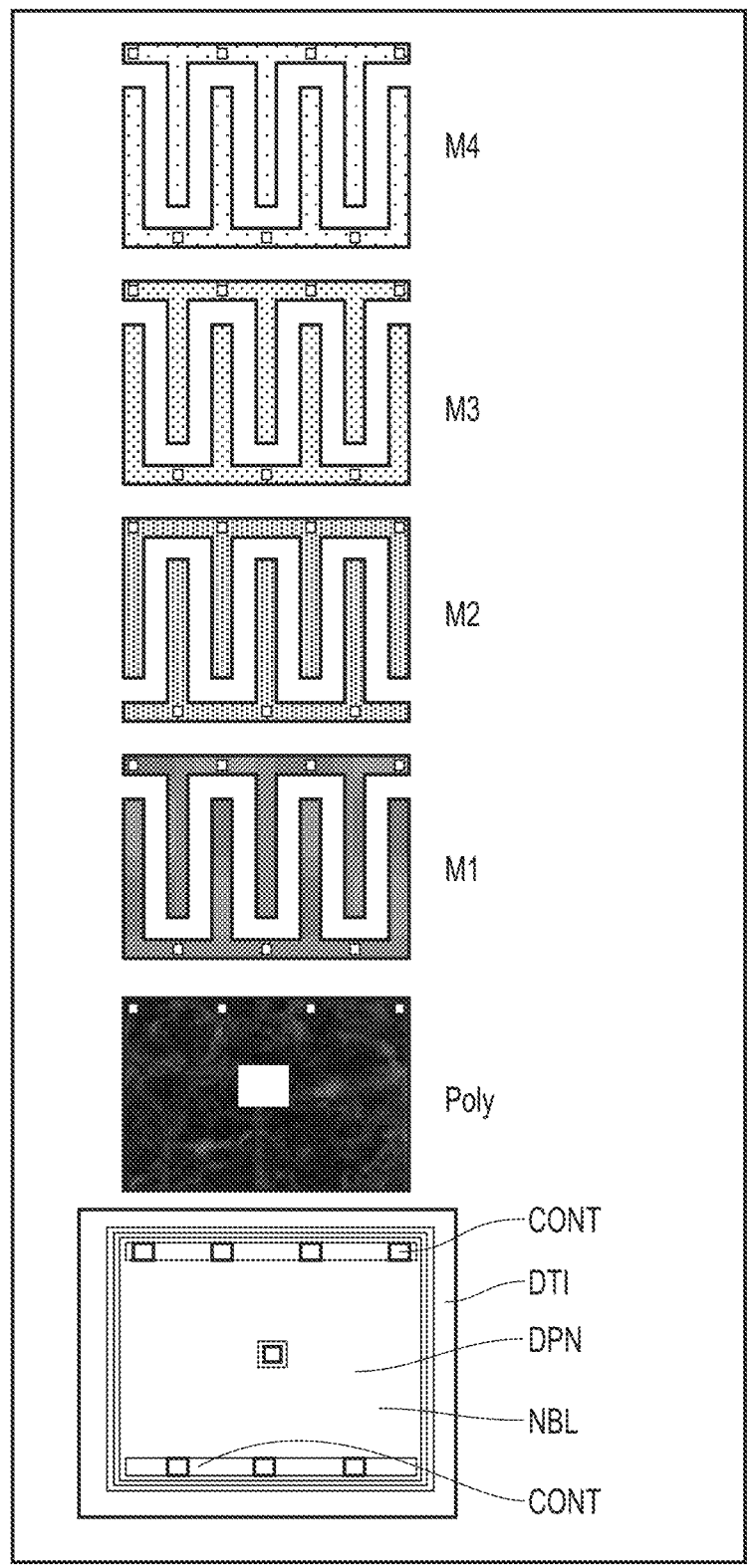
FIG. 7b shows an exploded view of various layers in an integrated capacitor such as that shown in FIG. 4.
Figure 7C:
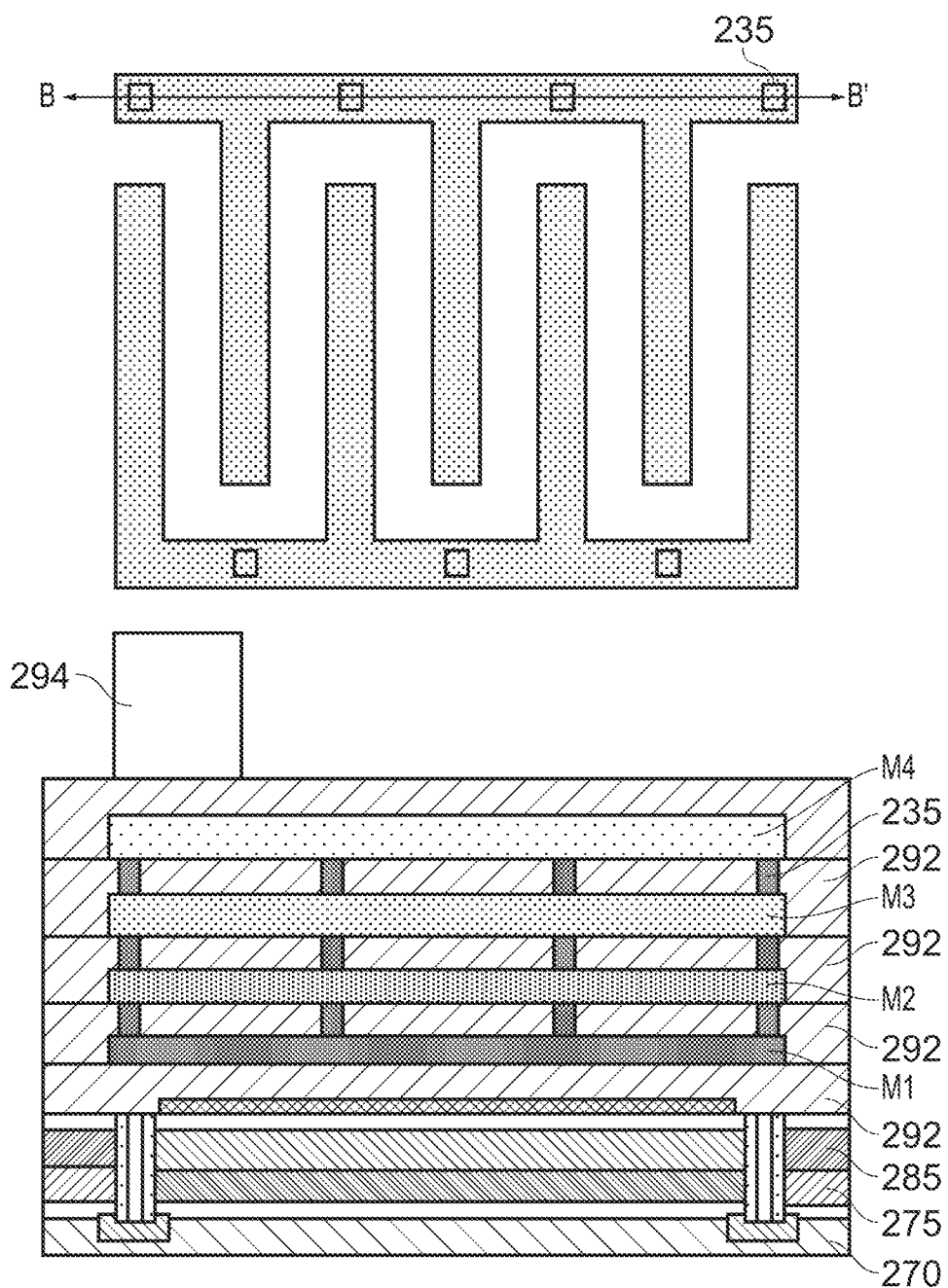
FIG. 7c shows the top metal view as shown in FIG. 7a, together with a second partial cross-section of an IC comprising an integrated capacitor such that shown in FIG. 4.

FIGS. 7a, 7b and 7c show a variety of views of an integrated capacitor comprising a four-level MIM and three other parallel capacitor elements, such as that shown in FIGS. 3a, 3b and 3c. As is immediately apparent, apart from the fact that there are four metal layers rather than the three metal layer shown in FIGS. 6a, 6b and 6c, embodiments illustrated by this figure are similar to those shown and described in FIGS. 6a, 6b and 6c, so will not be discussed in detail. However, it will be noticed that the thicknesses of the metal layers M1 and M2, as shown, may be different from the thicknesses of the upper layers M3 and M4. The person skilled in the art of SMART-MOS, or similar, integrated circuits will be aware that the design rules for such integrated circuits can provide for different thicknesses of the various metal layers within a metallisation stack. Thus embodiments of the present disclosure include metal layers which are the same thickness, and extends to metal layers having different thicknesses. Shown in the figure is a non-limiting example in which M3 and M4 have a greater thickness than M1 and M2.

Figure 8:
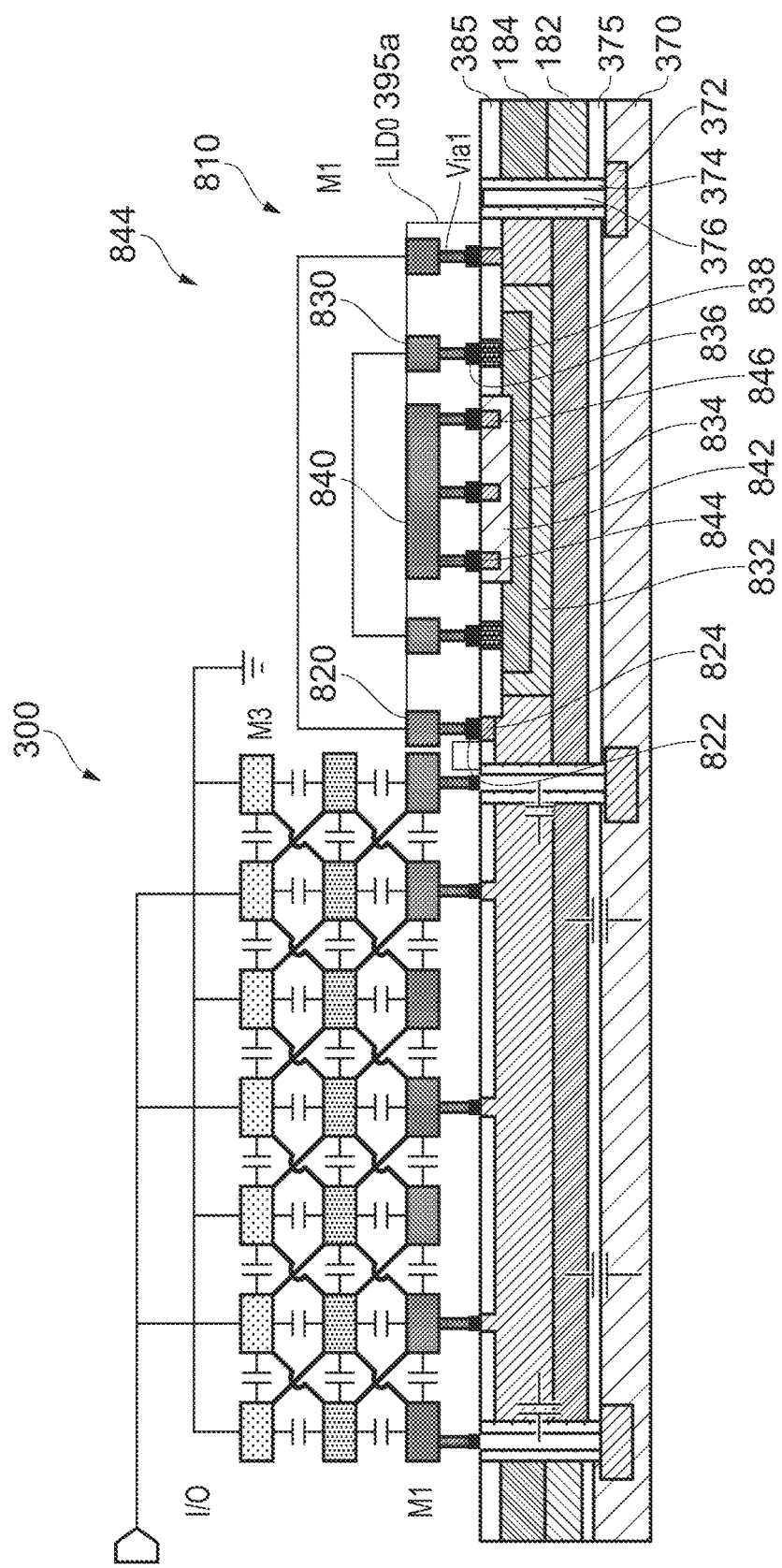
FIG. 8 shows a schematic view of an integrated circuit showing an integrated capacitor along with an active component.
Figure 9:
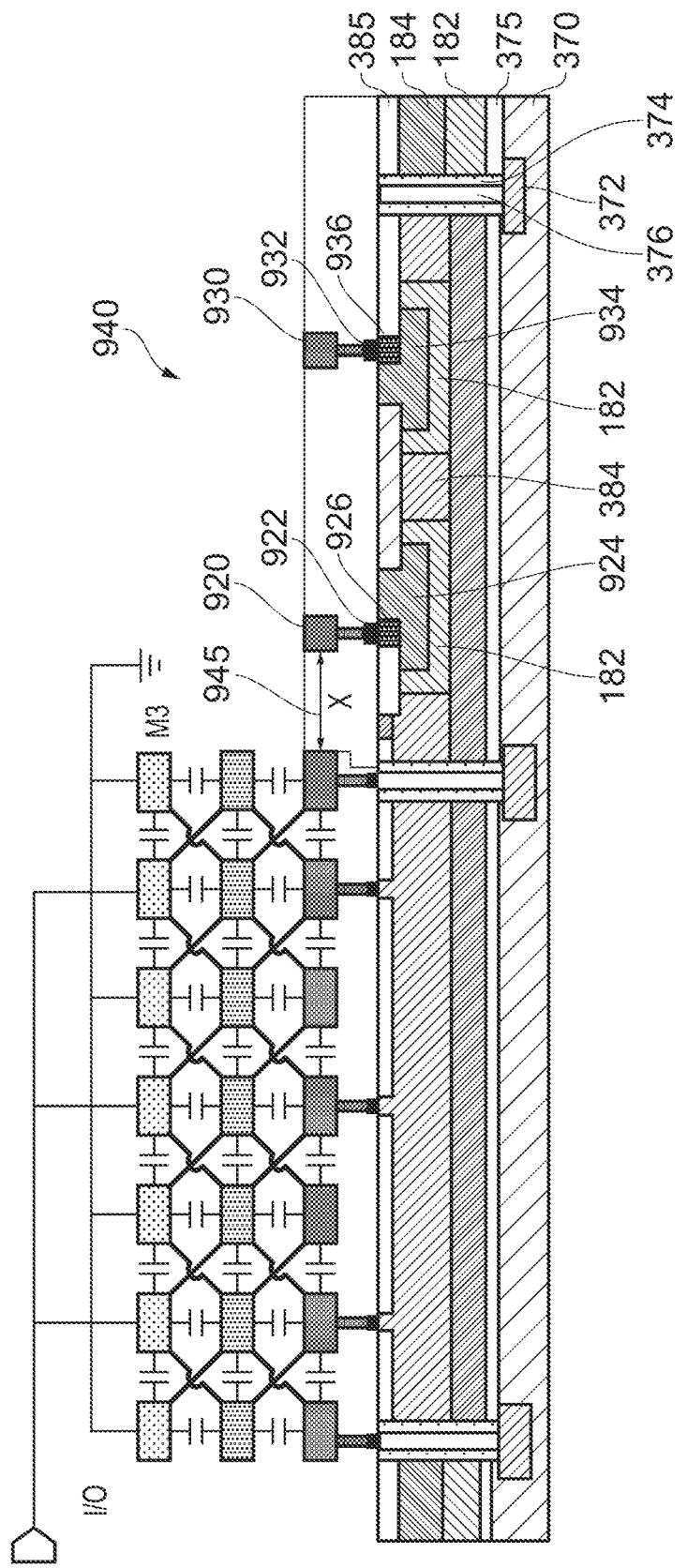
FIG. 9 shows a schematic view of an integrated circuit showing an integrated capacitor along with a further active component.

Turning now to FIGS. 8 and 9, these two figures illustrate, schematically, parts of an integrated circuit including an integrated capacitor according to embodiments of the present disclosure. Considering first FIG. 8, the integrated capacitor includes a three level MIM. The integrated capacitor 300 is the same as that depicted in FIG. 3 so will not be described in more detail; however the schematic also depicts an active device, in this case an NPN transistor, which illustrates how the semiconductor, metallic and insulating layers used to fabricate integrated capacitor are used in conventional process flow, for the fabrication of other component on the same integrated circuit. As already mentioned, in this particular example the illustrative other component is an active component being an NPN transistor, having collector 820, base 830 and emitter 840 metal contacts in at least the metal layer M1 (corresponding to the lowest metal layer in the metallisation stack of the device). The lowest metal layer in the metallisation stack is separated from the active device by the dielectric layer 395, which may also be called an inter-layer dielectric layer (and commonly referred to as ILD0). As can be seen from FIG. 8, the active device may be surrounded by a deep trench isolation structure, which may be the same as that for the integrated capacitor 300, and may be formed using the same process steps.

Thus the DTI structure may extend through the buried oxide layer, in order to achieve contact with the underlying substrate 370. In some embodiments the trench extends into the substrate. Typically, additional dopant is introduced into the exposed substrate at the bottom of the trench either by diffusion or ion implantation, as shown at 372 in FIG. 8. This more heavily doped layer of the substrate may have a doping level which is typically in a range of $10^{\wedge}18$-$10^{\wedge}20$ cm$^{-2}$, and may be in a preferred range of $10^{\wedge}19$-$10^{\wedge}20$ cm$^{-2}$.

The trench is lined using an insulating material 374. Conductive material, typically polysilicon, is then deposited into the central region of the trench 376. The trench may provide lateral isolation for the active device, or a group of active ices, from the remainder of the IC and in particular from the integrated capacitor 300. Typically, the oxide liner has a lateral thickness of between 200 and 600 nm or between 300 and 400 nm.

The active NPN transistor 810 the device is fabricated on the substrate 370, over which is the buried oxide layer 375, and includes a n-type buried layer NBL over the buried oxide, over which lies a deep n-type layer DPN, which is connected to a collector contact 822 by means of a more heavily doped N region 824. Confined by this deep n-type layer DPN is a p-type region 832, within which is a more heavily doped p-type region LVP 834, which itself is connected to the base contacts 836 by a yet more heavily doped p-type region 838. Finally, within the LVP 834 is a lightly doped n-type layer NLD 842, which is connected to an emitter contact 844 by means of a heavily doped n+ doped contact regions 846. As shown, each of the heavily doped regions 824, 838, 846 providing contact to the collector metal layer 820, base metal layer 830 and emitter metal layer 840 extend through the shallow trench isolation, STI layer 385.

From the above discussion, it will be appreciated that the layers used to form the three additional capacitances of an integrated capacitor according to the present disclosure, can be provided during standard manufacturing processes of the integrated circuit, and thus do not add additional complexity to the fabrication of the integrated circuit.

FIG. 9 illustrates, schematically, another part of an integrated circuit including an integrated capacitor according to embodiments of the present disclosure. In this case, the integrated capacitor is adjacent a PNP transistor having a floating base. Once again, similarly to the example shown in FIG. 8, the layers forming each of the additional capacitances of the integrated capacitor are deployed in the fabrication of the active device: the device is fabricated on the substrate 370, over which is a buried oxide layer 375. Over the buried oxide layer is a p-type epi layer 182, into which is formed a P-type well 184. Over the P-type well is shown a part of the STI layer 385. The PNP transistor is formed within the active semiconductor layers, and may be isolated from the remainder of the integrated circuit, by means of a different isolation structure DTI 372, 374, 376 as described above. The transistor includes an anode metal contact (shown in the first metal layer M1 as 920) and a cathode metal contact (shown in the first metal layer M1 as 930); the anode contacts 922 and cathode contact 932 are connected to respective p-type layers 924, 934 by means of heavily p-doped contact regions 926 and 936 respectively. The p-type layers 924, 934 are located within the p-type epi region 182, and isolated by parts of the deep n-well DPN 384.

Although not shown in FIGS. 8 and 9, the skilled person will appreciate that the metallisation stack over the active devices such as transistor 810, 910 will generally include additional layers metal layers M2, M3 etc. 390 with interlayer dielectric 395 therebetween in region 940 over the active devices, with at least three metal layers included in the case of a three layer MIM capacitor or with at least four metal layers included in the case of a four layer MIM capacitor. The associated layout, design rules et cetera of these additional, not shown, metal layers are entirely conventional. However it will be noted that in any individual metal layer the separation x, 945, between the outermost fingers of the MIM capacitor and metal tracks connecting active devices or other parts of the integrated circuit will typically be kept at or above a predetermined minimum separation. This minimum separation may follow conventional design rules for any particular integrated circuit design and in particular for any particular "node" of semiconductor technology. For example, for one particular CMOS 12 nm node, the minimum separation may be 800 nm.

FIG. 10 shows 4 plots of modelled capacitance on the ordinate or Y-axis against voltage bias on the abscissa or X-axis. The upper two plots 1010, 1020 show the capacitance of an integrated capacitor according to embodiments of the present disclosure and including, respectively, a four level MIM and a three level MIM, together with the three other—DTI capacitor, STI capacitor, and BOX capacitor—elements. The lower two plots 1030, 1040, show corresponding capacitance of an integrated capacitor which consists solely of the corresponding four level MIM and three level MIM respectively. As can be seen, the integrated capacitors according to embodiments have capacitance levels which are typically a factor of approximately 1.8 times higher than the stand-alone MIM integrated capacitors. For example, under a positive bias voltage the three-level MIM capacitance is increased from approximately 3.1 pF to 6 pF, and the four level MIM capacitance is increased from approximately 4.4 pF to approximately 7.1 pF. The improvements under negative bias is slightly less but still at least a 1.7 times improvement in capacitance. The figure also shows a —relatively small—nonlinearity around −5 to +2 V; the skilled person will appreciate that this nonlinearity is not so significant as to create design impediments.

From reading the present disclosure, other variations and modifications will be apparent to the skilled person. Such variations and modifications may involve equivalent and other features which are already known in the art of integrated capacitors, and which may be used instead of, or in addition to, features already described herein.

By now it will have been appreciated that the present disclosure extends to a silicon-on-insulator, SOI, integrated circuit, IC, comprising integrated capacitor, wherein the integrated capacitor comprises a parallel arrangement of a metal-insulator-metal, MIM, capacitor, a second capacitor, a third capacitor, and a fourth capacitor: wherein the MIM capacitor is comprised in a metallisation stack of the SOI IC; wherein the second capacitor comprises a substrate of the SOI IC, an n-type doped one of a plurality of semiconductor layers underneath the metallisation stack, and the buried oxide layer therebetween as dielectric; the third capacitor comprises a polysilicon layer between the metallisation stack and the plurality of semiconductor layers, and a further n-typed doped one of the plurality of semiconductor layers, and the an insulating layer therebetween as dielectric; and wherein the fourth capacitor comprises a polysilicon plug in a deep trench isolation structure and at least one of the plurality of semiconductor layers, and comprises the oxide-lining of the deep trench isolation structure as dielectric.

In embodiments, the lateral isolation structure (DTI) forms a perimeter of a region of the IC and the second capacitor, the third capacitor and the fourth capacitor each contained within the perimeter. In embodiments, the SOI further comprises a transistor outside a perimeter of the integrated capacitor. In embodiments, the plurality of semiconductors layers comprises an n-well layer having an N-type doping concentration of at least $5\times10^{18}$ cm$^{-2}$. In embodiments, the plurality of semiconductors layers comprises a buried n-well layer having an N-type doping concentration of at least $5\times10^{18}$ cm$^{-2}$. In embodiments, the n-well layer and the buried n-well layer fill the region of the IC defined by the perimeter.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality and reference signs in the claims shall not be construed as limiting the scope of the claims.

What is claimed is:

1. A silicon-on-insulator (SOI) integrated circuit (IC) comprising:
   a semiconductor substrate having first and second major surface;
   a buried oxide (BOX) layer on the first surface;
   a plurality of semiconductor layers over the BOX layer and comprising a plurality of regions and including at least an n-type buried layer (NBL) and a n-well (DPN);
   an insulating layer (STI) over the plurality of semiconductor layers;
   a patterned polysilicon layer (poly1) over the insulating layer;
   a metallisation stack comprising a plurality of patterned metal layers having layers of insulating material therebetween, the layers of insulating material each having a plurality of conducting vias therethrough connecting the patterned metal layers;
   a lateral isolation structure (DTI) comprising a plug of polysilicon material in a trench extending through the plurality of semiconductor layers to the first major surface and having an oxide lining;
   wherein the integrated circuit comprises an integrated capacitor comprising a parallel arrangement of a metal-insulator-metal (MIM) capacitor, a second capacitor, a third capacitor, and a fourth capacitor:
   wherein the MIM capacitor is comprised in the metallisation stack;
   the second capacitor comprises as plates the substrate and a one of the plurality of semiconductor layers having an n-type doping, and comprises the buried oxide layer as dielectric;
   the third capacitor comprises as plates the polysilicon layer and a further one of the plurality of semiconductor layers having an n-type doping, and comprises the insulating layer as dielectric; and
   the fourth capacitor comprises as plates the polysilicon plug and at least one of the plurality of semiconductor layers and comprises the oxide-lining as dielectric.

2. A SOI IC as claimed in claim 1, wherein the MIM capacitor, comprises a grid of conductive fingers separated by insulating material and is comprised in the metallisation stack, such that each patterned metal layer comprises a respective pair of comb-structured electrodes each having interdigitated fingers approximately perpendicular to a backbone, and each being galvanically coupled to a horizontally offset comb-structured electrode in a neighbouring layer, and wherein a one of the comb-structured electrodes on an upper metal layer comprises a first electrode of the integrated capacitor, and a one of the comb-structured electrodes on a lower-most metal layer is galvanically connected to the second capacitor.

3. A SOI IC as claimed in claim 2, wherein the horizontal offset between each comb-structured electrode and the comb-structured electrode in a neighbouring layer is equal to a finger spacing, such that oppositely galvanically connected fingers are vertically aligned.

4. A SOI IC as claimed in claim 1, wherein MIM capacitor has four metal layers.

5. A SOI IC as claimed in claim 1, wherein the one of the comb-structured electrodes on an upper metal layer is the uppermost layer.

6. A SOI IC as claimed in claim 1, wherein a thickness of one or more upper metal layers of the metallisation stack is greater than a thickness of one of more lower metal layers.

7. A SOI IC as claimed in claim 1, wherein the lateral isolation structure (DTI) forms a perimeter of a region of the IC and the second capacitor, the third capacitor and the fourth capacitor each contained within the perimeter.

8. A SOI IC as claimed in claim 1, further comprising a transistor outside a perimeter of the integrated capacitor.

9. A SOI IC as claimed in claim 1, wherein the plurality of semiconductors layers comprises a n-well layer having an N-type doping concentration of at least $5\times10^{18}$ cm−2.

10. A SOI IC as claimed in claim 1, wherein the plurality of semiconductors layers comprises a buried n-well layer having an N-type doping concentration of at least $5\times10^{18}$ cm−2.

11. A SOI IC as claimed in claim 10, wherein the n-well layer and the buried n-well layer fill the region of the IC defined by the perimeter.

12. A SOI IC as claimed in claim 1, wherein at least one of the buried oxide layer, the oxide lining, and the insulation layer has a thickness in a range of 300-450 nm.

13. A SOI IC as claimed in claim 1, wherein the trench of the lateral isolation structure (DTI) extends into the substrate.

14. A SOI IC as claimed in claim 1, wherein the semiconductor substrate underneath the polysilicon material in the trench has a higher doping level than a doping level of a rest of the semiconductor substrate underneath the MIM capacitor.

15. A silicon-on-insulator (SOI) integrated circuit (IC) comprising:
- an integrated capacitor, wherein the integrated capacitor comprises a parallel arrangement of a metal-insulator-metal (MIM) capacitor, a second capacitor, a third capacitor, and a fourth capacitor:
- wherein the MIM capacitor is comprised in a metallisation stack of the SOI IC;
- wherein the second capacitor comprises a substrate of the SOI IC, an n-type doped one of a plurality of semiconductor layers underneath the metallisation stack, and a buried oxide layer therebetween as dielectric;
- the third capacitor comprises a polysilicon layer between the metallisation stack and the plurality of semiconductor layers, and a further n-typed doped one of the plurality of semiconductor layers, and an insulating layer therebetween as dielectric; and
- wherein the fourth capacitor comprises a polysilicon plug in a deep trench isolation structure and at least one of the plurality of semiconductor layers, and comprises an oxide-lining of the deep trench isolation structure as dielectric.

16. A SOI IC as claimed in claim 15, wherein a lateral isolation structure forms a perimeter of a region of the IC and the second capacitor, the third capacitor and the fourth capacitor each contained within the perimeter.

17. A SOI IC as claimed in claim 15, further comprising a transistor outside a perimeter of the integrated capacitor.

18. A SOI IC as claimed in claim 15, wherein the plurality of semiconductors layers comprises a n-well layer having an N-type doping concentration of at least $5 \times 10^{18}$ cm$-2$.

19. A SOI IC as claimed in claim 18, wherein the plurality of semiconductors layers comprises a buried n-well layer having an N-type doping concentration of at least $5 \times 10^{18}$ cm$-2$.

20. A SOI IC as claimed in claim 19, wherein the n-well layer and the buried n-well layer fill the region of the IC defined by the perimeter.

* * * * *